(12) United States Patent
Borgmann et al.

(10) Patent No.: US 11,349,477 B2
(45) Date of Patent: May 31, 2022

(54) CONTROL ELEMENT

(71) Applicant: KOSTAL Automobil Elektrik GmbH & Co. KG, Luedenscheid (DE)

(72) Inventors: Uwe Borgmann, Recklinghausen (DE); Michael Bleckmann, Schwerte-Ergste (DE)

(73) Assignee: KOSTAL Automobil Elektrik GmbH & Co. KG, Luedenscheid (DE)

( * ) Notice: Subject to any disclaimer, the term of this patent is extended or adjusted under 35 U.S.C. 154(b) by 539 days.

(21) Appl. No.: 16/556,698

(22) Filed: Aug. 30, 2019

(65) Prior Publication Data

US 2019/0386660 A1 Dec. 19, 2019

Related U.S. Application Data

(63) Continuation of application No. PCT/EP2018/055070, filed on Mar. 1, 2018.

(30) Foreign Application Priority Data

Mar. 2, 2017 (DE) ...................... 10 2017 002 041.8

(51) Int. Cl.
*H03K 17/96* (2006.01)
*G05G 1/02* (2006.01)
(Continued)

(52) U.S. Cl.
CPC ............... *H03K 17/96* (2013.01); *B60J 5/00* (2013.01); *B60J 5/04* (2013.01); *B60J 5/0416* (2013.01);
(Continued)

(58) Field of Classification Search
CPC ..... H03K 17/96; B60J 5/00; B60J 7/00; B60J 5/04
(Continued)

(56) References Cited

U.S. PATENT DOCUMENTS 6,000,949 A * 12/1999 Takiguchi ........... B60R 16/0215
174/72 A
9,156,335 B1 * 10/2015 Harter ..................... E05B 79/06
(Continued)

FOREIGN PATENT DOCUMENTS

DE 10212768 A1 6/2003
DE 10341887 A1 3/2005
(Continued)

OTHER PUBLICATIONS

European Patent Office, International Search Report for International Application No. PCT/EP2018/055070, dated May 30, 2018.
(Continued)

*Primary Examiner* — D Glenn Dayoan
*Assistant Examiner* — Sunsurraye Westbrook
(74) *Attorney, Agent, or Firm* — Brooks Kushman P.C.

(57) ABSTRACT

A control element for roof or window adjustment in a motor vehicle includes a surface and a sensor. The surface has an introduced recess and a surface portion. The surface portion is connected to the surface in a gap-free manner above the recess. The surface portion only partially covers the recess. The sensor is formed within the surface portion or is arranged onto the bottom side thereof to detect deformations of the surface portion.

20 Claims, 3 Drawing Sheets

(51) Int. Cl.
*B60J 7/00* (2006.01)
*B60J 5/04* (2006.01)
*B60J 5/00* (2006.01)

(52) U.S. Cl.
CPC .................. *B60J 7/00* (2013.01); *G05G 1/02* (2013.01); *H01H 2300/006* (2013.01); *H01H 2300/01* (2013.01)

(58) Field of Classification Search
USPC .................................. 296/146.1–146.16, 152
See application file for complete search history.

(56) References Cited

U.S. PATENT DOCUMENTS

| | | | |
|---|---|---|---|
| 10,323,442 B2 * | 6/2019 | Kleve | E05B 77/54 |
| 10,435,926 B2 * | 10/2019 | Brown | E05B 85/103 |
| 10,493,826 B2 * | 12/2019 | Schwarz | E05F 15/60 |
| 2007/0131527 A1 | 6/2007 | Bobel et al. | |
| 2014/0000165 A1 | 1/2014 | Patel et al. | |

FOREIGN PATENT DOCUMENTS

| | | |
|---|---|---|
| DE | 112005003197 T5 | 10/2007 |
| DE | 102010024776 A1 | 12/2011 |
| DE | 102013212083 A1 | 1/2014 |
| DE | 102014222668 A1 | 5/2016 |

OTHER PUBLICATIONS

German Patent and Trademark Office, German Search Report for German Patent Application No. DE 10 2017 002 041.8 dated Jan. 23, 2018.
The International Bureau of WIPO, International Preliminary Report on Patentability for International Application No. PCT/EP2018/055070 dated Sep. 3, 2019.

* cited by examiner

CONTROL ELEMENT

CROSS-REFERENCE TO RELATED APPLICATIONS

This application is a continuation of International Application No. PCT/EP2018/055070, published in German, with an International filing date of Mar. 1, 2018, which claims priority to DE 10 2017 002 041.8, filed Mar. 2, 2017; the disclosures of which are hereby incorporated in their entirety by reference herein.

TECHNICAL FIELD

The present invention relates to a control element, in particular for roof or window adjustment in a motor vehicle, the control element having a surface including a recess, a surface portion contiguously connected to the surface above the recess, and a sensor to detect a deformation of the surface portion.

BACKGROUND

An actuating element, made of a hard plastic, in the form of a motor vehicle door handle, a handle recess, or a handle strip is known from DE 102 12 768 A1. A button that is actuatable with the thumb of a hand that grips the actuating element is situated in a cavity of the actuating element. It is provided that the tappet of the button is situated beneath a zone of the cavity wall that is deflectable when acted on by thumb pressure. The deflectable zone is a flexible soft plastic zone that is injection-molded together with the handle.

Control elements, in particular those for motor vehicles, are subject to continual changes in design. In contemporary designs of vehicles, individual functional or form elements are being increasingly combined, joints and height differences are being reduced, and lights and functions are not always visible. Sensory switching by means of touch sensors or force sensors offers the option to meet the demands of current design.

For control elements for window and sliding roofs, safety requirements such as US Standard FMVSS 571.118 make implementation difficult. Under this standard, with these control elements it must not be possible to accidentally close the window or the roof. This requirement is usually met via a design that does not allow actuation by a particular test object.

In addition, these control elements are generally equipped with an actuating step for manual, and an actuating step for automatic, operation of a window/roof.

SUMMARY

An object is to provide a control element for windows or sliding roofs that has a closed, gap-free surface, meets the requirements of the relevant standards, and allows convenient opening of the window or roof.

In embodiments of the present invention, such control element has a surface having a recess and a surface portion. The recess is introduced or integrated into the surface. The surface portion is contiguously connected to the surface (i.e., the surface portion is connected to the surface in a gap-free manner) and protrudes over the recess. Such control element further includes a sensor.

In embodiments of the present invention, the object is achieved, firstly, in that the surface portion connected to the surface in a gap-free manner only partially covers the recess (i.e., covers the recess only in part), and the sensor is formed within the surface portion (e.g., completely or partially molded into the surface portion) and detects deformations of the surface portion.

In embodiments of the present invention, the object is achieved, secondly, in that the surface portion connected to the surface in a gap-free manner only partially covers the recess, and the sensor is formed onto the bottom side of the surface portion (e.g., completely or partially arranged on or molded onto the bottom side of the surface portion) and detects deformations of the surface portion.

The first approach according to embodiments of the present invention provides that a sensor for detecting the deformation of the surface portion is formed within the surface portion (e.g., completely molded into the surface portion) so that the sensor is situated so as not to be externally visible from all sides.

The second approach according to embodiments of the present invention provides that a sensor for detecting the deformation of the surface portion is formed onto the bottom side of the surface portion (e.g., molded onto the bottom side of the surface portion or affixed, for example by adhesive bonding). As a result, the sensor likewise has a very inconspicuous arrangement, and installation of the sensor in many cases is easier than with the first approach.

The control element resembles a push/pull button and is made up of a closed surface. The structure has a flexible design in the actuation area, so that a deformation of the surface takes place upon actuation. The force and the direction of an actuation can be detected by measuring the deformation. In conjunction with an adjustment element moving at a variable speed, it is thus possible for the user to control not only the direction, but also the speed of the adjustment element.

BRIEF DESCRIPTION OF THE DRAWINGS

The present invention is explained in greater detail below and illustrated with reference to the drawings, which show the following.

DETAILED DESCRIPTION

Detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
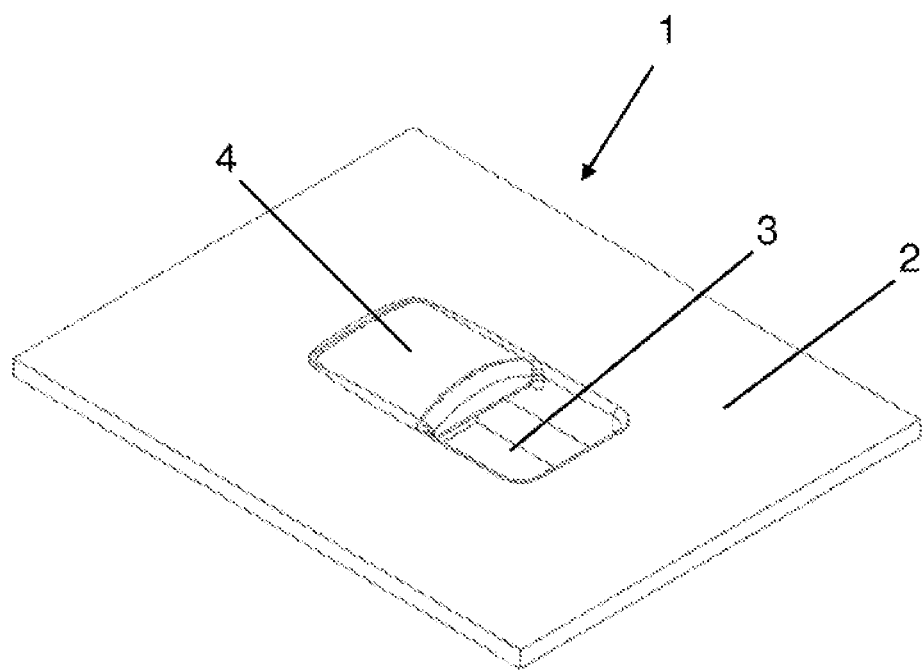
FIG. 1 illustrates a top view of a control element.

FIG. 1 illustrates a control element designed according to embodiments of the present invention in a top view. Control element 1 has a surface 2 with an exterior structured design. Surface 2 depicted in FIG. 1 may in particular be a detail from a larger contiguous control surface or interior surface in a motor vehicle.

The structuring is formed by integrally molding a depression (i.e., trough), referred to below as a recess 3, into surface 2. Only a part, preferably between one-fourth and one-half of the total surface area of opening of recess 3, is covered by a surface portion 4, which is integrally joined to the remaining surface 2.

Figure 2:
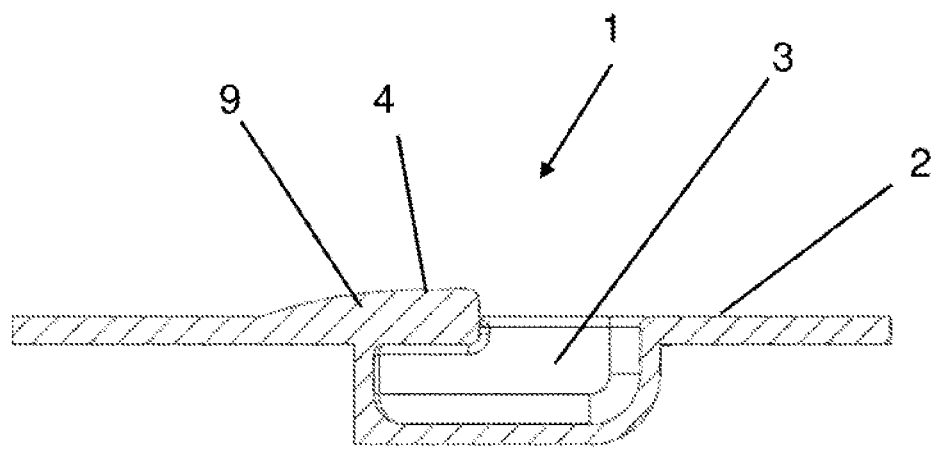
FIG. 2 illustrates the control element in a sectional view.

As illustrated in the sectional view in FIG. 2, surface 2 forms a material-reinforced portion 9, of which a part, as surface portion 4, protrudes beyond an edge of recess 3. This surface portion 4 forms the actuation area of control element 1.

As shown in FIG. 1, except for the edge of surface portion 4 extending in the direction of opening of recess 3, all other edges of surface portion 4 are connected to surface 2 in a gap-free manner.

As a result, surface portion 4 is not freely movable, and in particular is not situated so as to be pivotable about an edge. However, due to its shape and material thickness, surface portion 4 is designed in such a way that it is deformable to a certain extent by an application of force from the top side, or from the bottom side on the side of recess 3.

The forces necessary for actuating control element 1 may be influenced by the setting of the wall thickness in the area of surface portion 4. Unlike the situation illustrated here, surface 2 on the one hand and surface portion 4 on the other hand could also be made of different plastic materials that are integrally joined together, for example by multicomponent injection molding.

To allow an actuation of surface portion 4 from its bottom side, it is advantageous when a width 7 of the space that results between a base 6 of recess 3 ("recess base 6") and surface portion 4 is dimensioned to be large enough for engagement by a fingertip.

Figure 3:
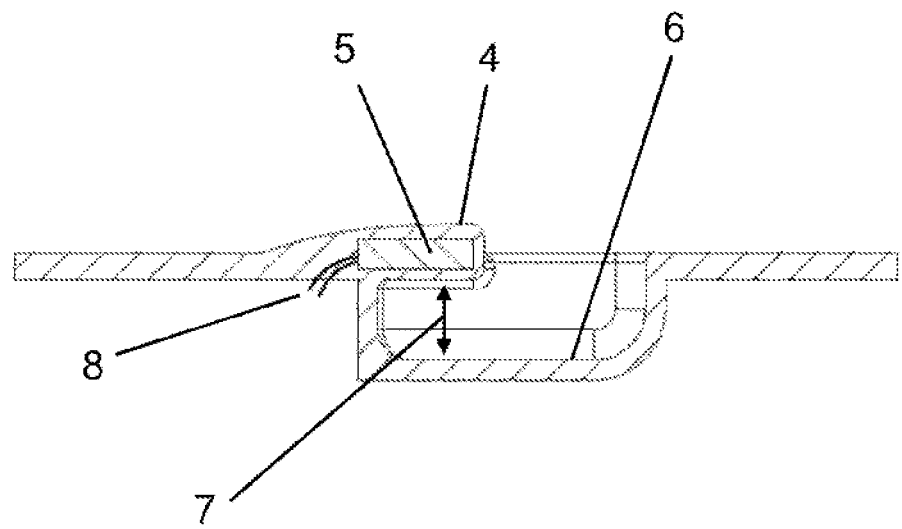
FIGS. 3, 4, 5, and 6 each illustrate the control element in a sectional view with various designs of a sensor.

In order to record an application of force as an actuation of control element 1, a sensor 5, 5', 5", 5''' is provided that detects deformations of surface portion 4. Such sensors 5, 5', 5", 5''' may function according to various physical measuring principles. FIGS. 3 and 5 each show a one-piece design of a sensor 5, 5", respectively; and FIGS. 4 and 6 each show a design of a sensor 5', 5''' that is made up of multiple sensor components 5a, 5b; 5a', 5b', respectively.

The one-piece sensor 5 in FIG. 3 may be a strain gauge, for example, that is molded into surface portion 4, for example extrusion-coated during the manufacture of control element 1 in an injection mold. Feed lines 8 of sensor 5 are led out from the plastic material at the bottom side of control element 1, so that an evaluation electronics system (not shown) that is part of sensor 5 may be situated outside the plastic body.

A one-piece sensor 5" designed as a strain gauge, for example, may also be molded onto or arranged on the bottom side of surface portion 4. This design is depicted in FIG. 5 and spares the extrusion coating of sensor 5", which in this case, for example, is simply affixed to the bottom side of surface portion 4 by adhesive bonding.

Figure 4:
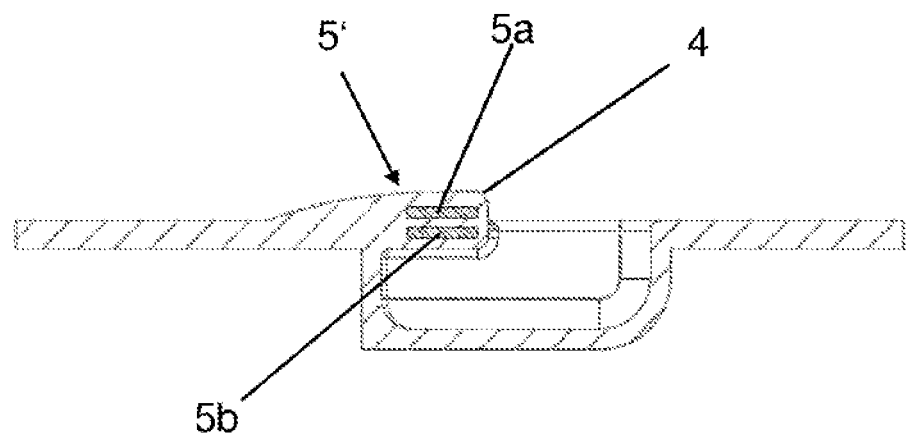
Figure 5:
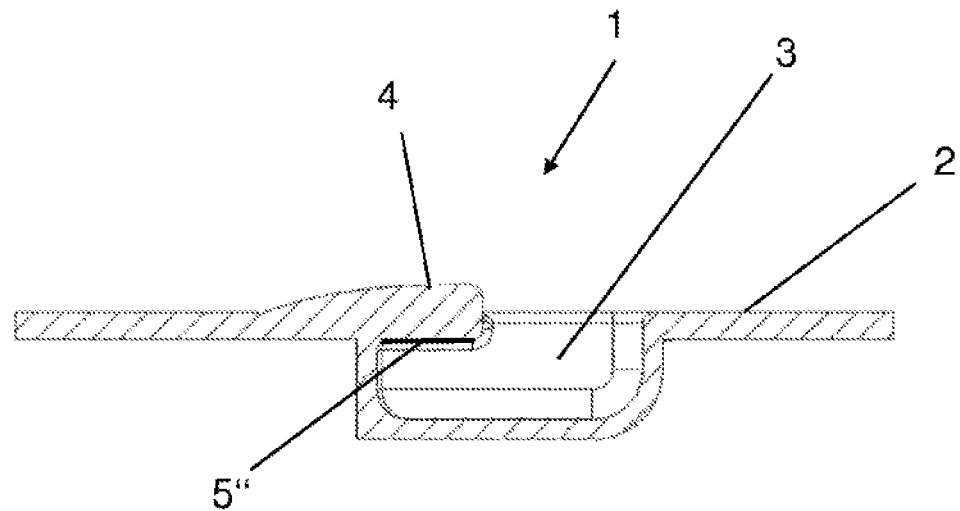
Figure 6:
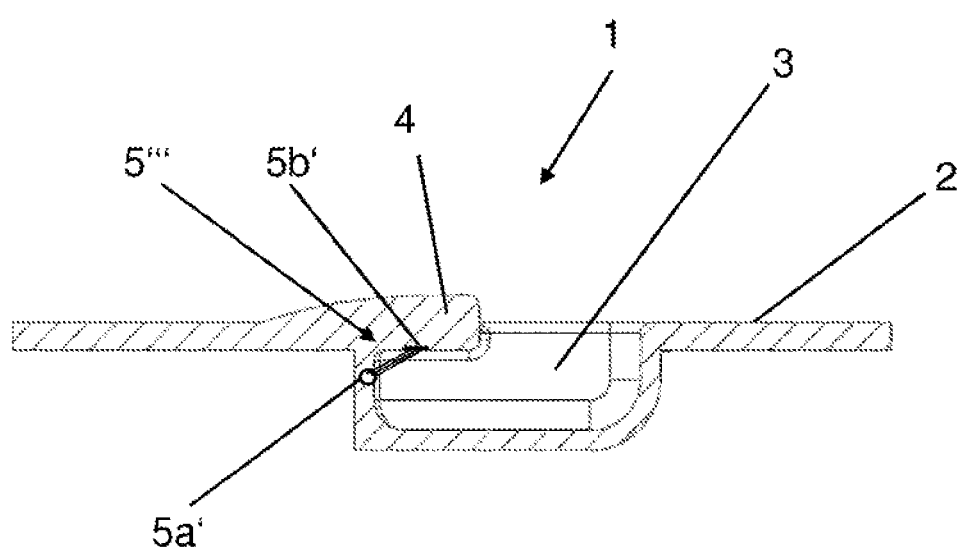

Some measuring principles require a multipart sensor design, as depicted in each of FIGS. 4 and 6. Sensors 5' and 5''' here are respectively made up of two sensor components 5a, 5b; 5a', 5b' by way of example.

According to FIG. 4, both sensor components 5a, 5b are injected into surface portion 4. Sensor 5' may form an optical sensor, for example; in this case, sensor components 5a, 5b are made up of a light transmitter and a light receiver. If an inductive sensor is to be used, then sensor components 5a, 5b are made up of an induction coil and a metal body, for example, whose displacements relative to one another during a deformation of surface portion 4 may be detected.

FIG. 6 shows another two-part sensor 5''' that is made up of two sensor components 5a', 5b', and here in particular represents an optical sensor comprising a light transmitter 5a' and a light receiver 5b'. In contrast to the design illustrated in FIG. 4, sensor components 5a', 5b' here are not completely molded into surface portion 4. Instead, light receiver 5b' is situated on the bottom side of surface portion 4, particularly preferably in such a way that the outer surface of a light-incident window that is part of light receiver 5b' is planarly aligned with the bottom side of surface portion 4. Light receiver 5b' is illuminated by a light transmitter 5a' that is molded onto or into a wall section of recess 3, so that the surface of light transmitter 5a' extends to the surface of the wall section. The quantity of light from light transmitter 5a' that is incident on light receiver 5b' changes when surface portion 4 is deformed, so that light receiver 5b' can quantitatively detect deformations of surface portion 4. By use of light receiver 5b' which measures with spatial resolution, for example, it is also possible to distinguish between compressive and tensile effects on surface portion 4.

Sensors 5, 5', 5", 5''', which are suited for recording deformations of surface portion 4, are generally able to detect compressive loads as well as tensile loads that result from applications of force to the top side or to the bottom side of surface portion 4. It is advantageous when sensor 5, 5', 5", 5''' or the evaluation electronics system coupled thereto is suitable not only for detecting such actuations, but also for distinguishing between their directions in order to be able to appropriately resolve multiple actuation functions.

For many applications, it is advantageous when sensor 5, 5', 5", 5''' is also able to quantitatively detect the severity of the deformation of surface portion 4, and thus the force of the actuation. It is thus possible, for example, to vary the adjustment speed of a vehicle window or vehicle roof as a function of the actuating force of control element 1. In addition, the transition from a manual to an automatic adjustment of motor-actuated vehicle windows or vehicle roofs may also be designed as a function of the strength of the actuating force acting on surface portion 4.

LIST OF REFERENCE NUMERALS

1 control element
2 surface
3 recess
4 surface portion
5, 5', 5", 5''' sensor
5a, 5b, 5a', 5b' sensor components
6 recess base
7 width
8 feed lines
9 material-reinforced portion While exemplary embodiments are described above, it is not intended that these embodiments describe all possible forms of the present invention. Rather, the words used in the specification are words of description rather than limitation, and it is understood that various changes may be made without departing from the spirit and scope of the present invention. Additionally, the features of various implementing embodiments may be combined to form further embodiments of the present invention.

What is claimed is:

1. A control element for roof or window adjustment in a vehicle, the control element comprising:
   a surface having a recess and a surface portion, the surface portion being contiguously connected to the surface and protruding over the recess;
   a sensor; and wherein the surface portion only partially covers the recess and the sensor is arranged within the surface portion to detect deformations of the surface portion.

2. The control element of claim 1 wherein:
the surface is formed from a single plastic material.

3. The control element of claim 1 wherein:
the sensor is a contactless sensor.

4. The control element of claim 1 wherein:
the sensor is configured to recognize and distinguish between compressive and tensile effects on the surface portion.

5. The control element of claim 1 wherein:
the sensor is configured to quantitatively detect severity of a deformation of the surface portion to determine an actuating force.

6. The control element of claim 1 wherein:
the control element is a push/pull button.

7. The control element of claim 1 wherein:
the sensor is a strain gauge.

8. The control element of claim 1 wherein:
the surface portion covers between one-fourth and one-half of the recess to only partially covers the recess.

9. The control element of claim 1 wherein:
the sensor is an optical sensor having a first sensor component which is a light transmitter and a second sensor component which is a light receiver.

10. The control element of claim 1 wherein:
the sensor is an inductive sensor having a first sensor component which is an induction coil and a second sensor component which is a metal body.

11. A control element for roof or window adjustment in a vehicle, the control element comprising:
a surface having a recess and a surface portion, the surface portion being contiguously connected to the surface and protruding over the recess;
a sensor; and
wherein the surface portion only partially covers the recess and the sensor is least partially arranged on a bottom side of the surface portion to detect deformations of the surface portion.

12. The control element of claim 11 wherein:
the surface is formed from a single plastic material.

13. The control element of claim 11 wherein:
the sensor is a contactless sensor.

14. The control element of claim 11 wherein:
the sensor is configured to recognize and distinguish between compressive and tensile effects on the surface portion.

15. The control element of claim 11 wherein:
the sensor is configured to quantitatively detect severity of a deformation of the surface portion to determine an actuating force.

16. The control element of claim 11 wherein:
the control element is a push/pull button.

17. The control element of claim 11 wherein:
the sensor is a strain gauge.

18. The control element of claim 11 wherein:
the surface portion covers between one-fourth and one-half of the recess to only partially covers the recess.

19. The control element of claim 11 wherein:
the sensor is an optical sensor having a first sensor component which is a light transmitter and a second sensor component which is a light receiver.

20. The control element of claim 11 wherein:
the sensor is an inductive sensor having a first sensor component is an induction coil and a second sensor component which is a metal body.

* * * * *